(12) United States Patent
Tohara et al.

(10) Patent No.: US 10,261,132 B2
(45) Date of Patent: Apr. 16, 2019

(54) ELECTRICITY STORAGE SYSTEM AND METHOD OF ESTIMATING CHARACTERISTIC PARAMETER

(71) Applicant: Kabushiki Kaisha Toshiba, Minato-ku (JP)

(72) Inventors: Masahiro Tohara, Minato-ku (JP); Mami Mizutani, Minato-ku (JP); Makoto Ide, Minato-ku (JP); Takenori Kobayashi, Minato-ku (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/321,603

(22) PCT Filed: Feb. 24, 2015

(86) PCT No.: PCT/JP2015/055157
§ 371 (c)(1),
(2) Date: Dec. 22, 2016

(87) PCT Pub. No.: WO2015/198632
PCT Pub. Date: Dec. 30, 2015

(65) Prior Publication Data
US 2018/0149703 A1    May 31, 2018

(30) Foreign Application Priority Data

Jun. 24, 2014 (JP) .................. 2014-129242

(51) Int. Cl.
*G01R 31/36* (2019.01)
*H01M 10/44* (2006.01)
(Continued)

(52) U.S. Cl.
CPC ......... *G01R 31/3634* (2013.01); *G01R 31/36* (2013.01); *G01R 31/3631* (2013.01);
(Continued)

(58) Field of Classification Search
None
See application file for complete search history.

(56) References Cited

U.S. PATENT DOCUMENTS 9,157,966 B2    10/2015    Papana et al.
9,360,911 B2     6/2016    Jau et al.
(Continued)

FOREIGN PATENT DOCUMENTS

CA    2 643 684 A1    4/2010
JP    2007-330045 A   12/2007
(Continued)

OTHER PUBLICATIONS

Ishii Hiroshi et al.; Motor-Driven device and charge/discharge of battery unit; Publication Date: Feb. 16, 2001; Tokyo R&D Co Ltd; JP2001-045673; H02J7/02.*
(Continued)

*Primary Examiner* — Melissa J Koval
*Assistant Examiner* — Nasima Monsur
(74) *Attorney, Agent, or Firm* — Oblon, McClelland, Maier & Neustadt, L.L.P.

(57) ABSTRACT

An electricity storage system includes a plurality of chargeable and dischargeable battery boards, a plurality of PCSs connected to the respective battery boards, and charging and discharging the connected batteries, and a battery controller distributing a charging and discharging power value of the entire system as an instruction value to each of the PCSs at a constant cycle or at an arbitrary timing. The battery controller gives a charging and discharging instruction for a predefined test charging and discharging to the selected battery board, and distributes, to all the battery boards except the selected battery board, a value obtained by subtracting a charging and discharging power value for the
(Continued)

test charging and discharging from a charging and discharging power value for the entire system.

9 Claims, 6 Drawing Sheets

(51) Int. Cl.
H01M 10/48 (2006.01)
H02J 7/00 (2006.01)

(52) U.S. Cl.
CPC ..... *G01R 31/3658* (2013.01); *G01R 31/3662* (2013.01); *H01M 10/44* (2013.01); *H01M 10/441* (2013.01); *H01M 10/48* (2013.01); *H01M 10/482* (2013.01); *H02J 7/0021* (2013.01); *H02J 7/0068* (2013.01); *H01M 2220/10* (2013.01); *H02J 7/0022* (2013.01); *H02J 2007/005* (2013.01); *H02J 2007/0067* (2013.01)

(56) References Cited

U.S. PATENT DOCUMENTS

| 2001/0028238 A1* | 10/2001 | Nakamura | G01R 31/3662 |
| | | | 320/132 |
| 2009/0013521 A1* | 1/2009 | Okumura | H01M 10/44 |
| | | | 29/730 |
| 2011/0127962 A1* | 6/2011 | Murao | H02J 7/0016 |
| | | | 320/118 |
| 2012/0176094 A1 | 7/2012 | Okuda et al. | |
| 2013/0030735 A1 | 1/2013 | Jau et al. | |
| 2013/0082519 A1 | 4/2013 | Nagakura et al. | |
| 2013/0082641 A1* | 4/2013 | Nishibayashi | H02J 3/32 |
| | | | 320/106 |
| 2013/0138369 A1 | 5/2013 | Papana et al. | |
| 2014/0141360 A1 | 5/2014 | Yamaguchi et al. | |
| 2015/0077125 A1 | 3/2015 | Nomura | |
| 2016/0013670 A1 | 1/2016 | Tohara et al. | |
| 2016/0103183 A1 | 4/2016 | Jau et al. | |

FOREIGN PATENT DOCUMENTS

| JP | 2013-31359 A | 2/2013 |
| JP | 2013-44598 A | 3/2013 |
| JP | 2013-122450 A | 6/2013 |
| JP | WO 2013/140904 A1 | 9/2013 |
| JP | 2013-239328 A | 11/2013 |
| JP | 2014-171335 A | 9/2014 |
| KR | 10-1160545 B1 | 6/2012 |
| KR | 10-2013-0025408 A | 3/2013 |
| KR | 10-2014-0070217 A | 6/2014 |
| WO | WO 2012/176868 A1 | 12/2012 |
| WO | WO 2013/154444 A2 | 10/2013 |

OTHER PUBLICATIONS

International Search Report dated May 19, 2015, in PCT/JP2015/055157 filed Feb. 24, 2015.

* cited by examiner

ELECTRICITY STORAGE SYSTEM AND METHOD OF ESTIMATING CHARACTERISTIC PARAMETER

CROSS-REFERENCE RELATED APPLICATIONS

This application is based upon and claims a priority of Japanese Patent Application No. 2014-129242, filed on Jun. 24, 2014, the entire contents being incorporated herein by reference.

CROSS-REFERENCE RELATED APPLICATIONS

This application is based upon and claims a priority of Japanese Patent Application No. 2014-129242, filed on Jun. 24, 2014, the entire contents being incorporated herein by reference.

TECHNICAL FIELD

Embodiments of the present disclosure relate to an electricity storage system that is capable of highly precisely grasping the status of a battery without suspending the operation of a system which is a combination of a plurality of chargeable and dischargeable batteries, and a method of estimating characteristic parameters of each battery in such a system.

BACKGROUND ART

Application of a large-scale electricity storage system including secondary batteries is expected for suppressing fluctuation of a power generation that utilizes natural energy, such as solar light or wind power, suppressing fluctuation of a power demand, and shifting a peak. In order to enable an operation that accomplishes the maximum performance in such a large-scale electricity storage system, it is important to precisely grasp the characteristic of the secondary battery (hereinafter, also simply referred tows "battery") at a given time point, i.e., the status like a capacity and an internal resistance.

Several schemes have been already proposed to estimate the capacity of the battery and the internal resistance thereof with the system being in an operated status. For example, a method of obtaining an open circuit voltage by calculation based on the closed circuit voltage, the current, and the temperature to obtain a State Of Charge (SOC, battery remaining level), and calculating the battery capacity by utilizing a correlation and an extrapolation, and a method of obtaining an internal resistance by parameter identification using a model and by learning under various conditions are known.

CITATION LIST

Patent Literatures

Patent Document 1: JP2013-122450 A
Patent Document 2: JP2013-044598 A

SUMMARY OF INVENTION

Technical Problem

Both methods explained above are to accomplish a parameter estimation under an operated status, but there is an inevitable technical problem such that both methods depend on the charging and discharging condition under the operated status. That is, in a status in which charging and discharging is not performed at all and current does not flows, the internal resistance cannot be estimated, and in order to precisely estimate the internal resistance, a current fluctuation to some level is necessary. Likewise, when the SOC fluctuation is zero, the capacity cannot be estimated, and in order to precisely estimate the capacity, an SOC fluctuation to some level is necessary.

Conversely, in order to grasp the capacity of the battery and internal resistance thereof with high precision, the surest and most precise method is to suspend the operation of the target system to perform test charging and discharging, and to measure the actual value. However, although the suspension of the operation of the electricity storage system is temporal, this causes a reduction of the operation availability, i.e., a time slot at which the system is not available for the original purpose. Conversely, in the case of the estimation method under an operated status, the estimation precision decreases depending on the operation status, i.e., the charging and discharging pattern.

Embodiments of the present disclosure is to provide an electricity storage system that is capable of highly precisely grasping the status of a battery without suspending the operation of a system which is a combination of a plurality of chargeable and dischargeable batteries, and a method of estimating the characteristic parameters of each battery in such a system.

Solution to Problem

In order to accomplish the above objective, an electricity storage system according to an embodiment of the present disclosure includes:

a plurality of chargeable and dischargeable batteries;

a plurality of charging and discharging devices connected to the respective batteries, and charging and discharging the connected batteries; and a battery controller distributing a charging and discharging power value of the entire system as an instruction value to each of the charging and discharging devices at a constant cycle or at an arbitrary timing, in which the battery controller gives a charging and discharging instruction for a predefined test charging and discharging to the selected battery, and distributes, to all the batteries except the selected battery, a value obtained by subtracting a charging and discharging power value for the test charging and discharging from a charging and discharging power value for the entire system.

In addition, a method of estimating characteristic parameters according to an embodiment of the present invention is a method of estimating characteristic parameters of each battery in an electricity storage system that is a combination of a plurality of the chargeable and dischargeable batteries, and the method includes:

a step of selecting the battery to estimate the characteristic parameters; and a step of giving a charging and discharging instruction for a predefined test charging and discharging to the selected battery, and distributing, to all the batteries except the selected battery, a value obtained by subtracting a charging and discharging power value for the test charging and discharging from a charging and discharging power value as the entire system.

DESCRIPTION OF EMBODIMENTS

Embodiments of the present disclosure will be explained in detail with reference to the figures.

(Entire Configuration of Electricity Storage System)

Figure 1:
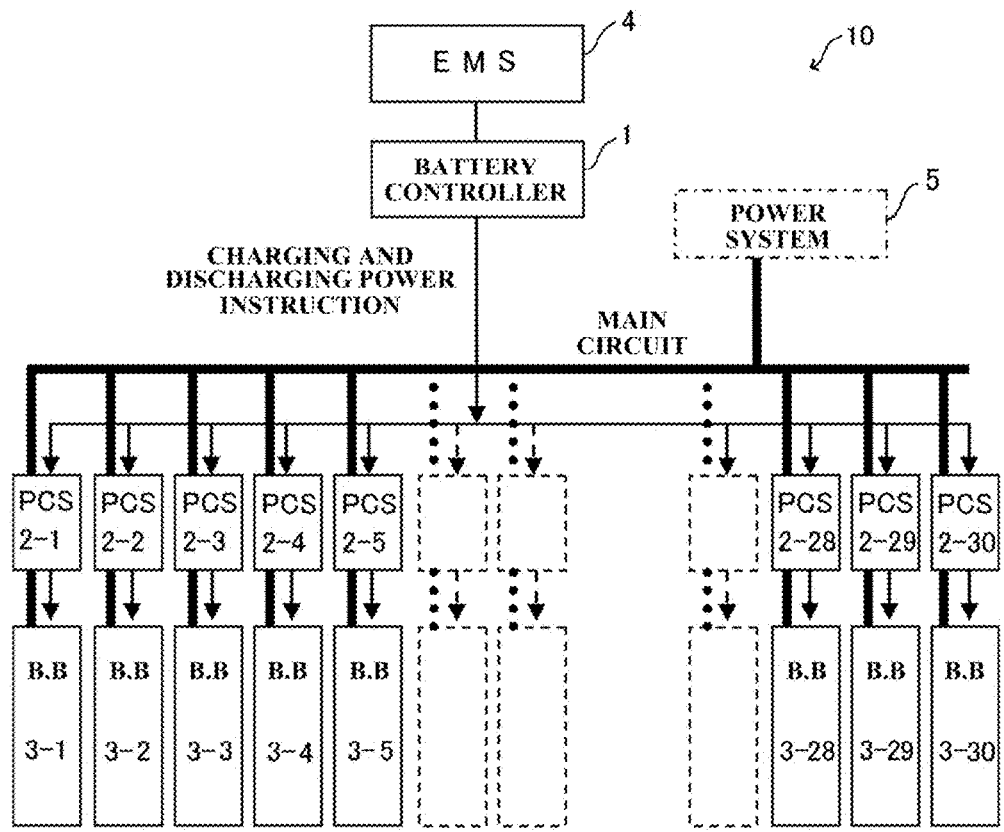
FIG. 1 is a schematic diagram illustrating a configuration of an electricity storage system according to an embodiment of the present disclosure.

FIG. 1 illustrates a configuration of an electricity storage system according to an embodiment of the present disclosure.

An electricity storage system 10 includes a battery controller 1 that distributes charging and discharging power to each battery, a plurality of (e.g., 30) Power Control Systems (PCSs) 2-1 to 2-30 which is connected to each battery and which controls charging and discharging of each battery, and a plurality of (e.g., 30) battery boards (also referred to as battery or battery group) 3-1 to 3-30 which is provided so as to correspond to the PCSs 2-1 to 2-30 one to one, and which is capable of performing charging and discharging. In this electricity storage system 10, wide variety of battery boards 3-1 to 3-30 are connected to the DC sides of the corresponding PCSs 2-1 to 2-30, and all AC sides of the PCSs 2-1 to 2-30 are connected in parallel for an interconnection with a power system 5.

In addition, the PCSs 2-1 to 2-30 are all connected to the battery controller 1, and can be controlled the charging and discharging by the battery controller 1. In addition, the battery controller 1 is connected to an Energy Management System (EMS) 4 located at a higher hierarchy layer via signal lines so as to receive a charging and discharging power instruction value for the entire electricity storage system 10 at a constant cycle or an arbitrary timing.

Figure 2:
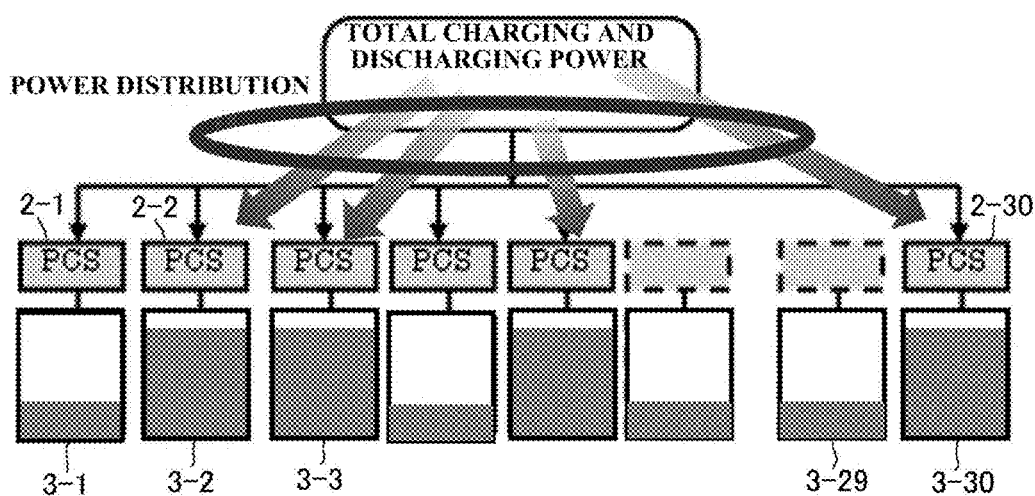
FIG. 2 is an image diagram illustrating power distribution to each battery in the electricity storage system in FIG. 1.

In accordance with the charging and discharging power instruction value (total value as entire system) from the EMS 4, the battery controller 1 distributes the power value to the respective PCSs 2-1 to 2-30. As illustrated in FIG. 2, in a normal operation, the battery controller 1 distributes, as appropriate, the charging and discharging power value from the EMS 4 to the respective PCSs 2-1 to 2-30 in accordance with, for the example, the SOC statuses of the respective battery boards 3-1 to 3-30.

When the instruction value from the EMS 4 is smaller than the value equivalent to the rated power value of the electricity storage system 10, the battery controller 1 has a degree of freedom for power distribution. By utilizing this degree of freedom, even if the instruction value from the EMS 4 is constant, the charging and discharging power of a particular PCS can be changed as intended for the other purposes than the original purpose while the constant total value of the power distribution to all PCSs 2-1 to 2-30 is maintained (i.e., so as to follow the instruction from the EMS 4 purposefully). By utilizing this structure, a test charging and discharging is performed on the battery board connected to the particular PCS to measure the actual characteristic parameters (e.g., capacity, internal resistance) relating to the internal status.

(Configuration of Battery Controller 1)

Figure 3:
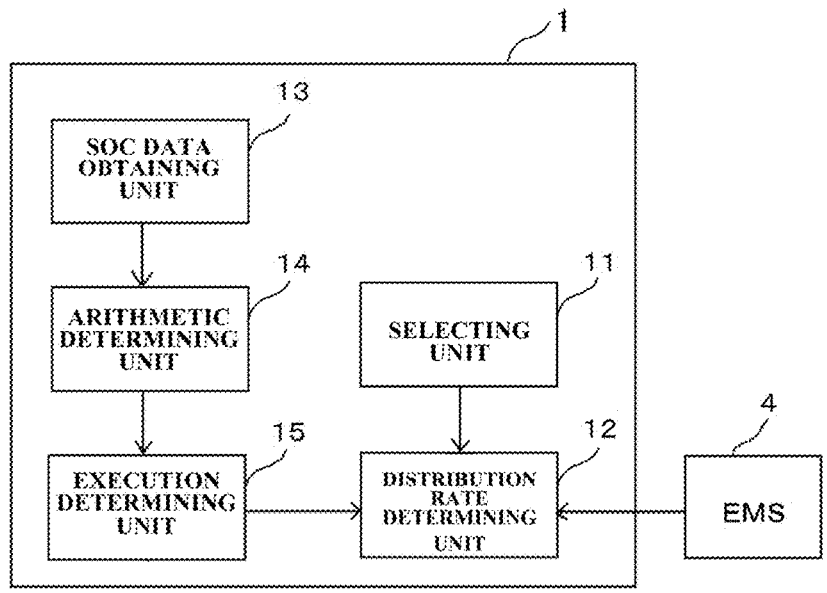
FIG. 3 is a block diagram illustrating a detailed configuration of a battery controller in FIG. 1.

FIG. 3 illustrates a configuration of the battery controller 1 in detail.

The battery controller 1 includes a selecting unit 11, a distribution rate determining unit 12, an SOC data obtaining unit 13, an arithmetic determining unit 14, and an execution determining unit 15.

The selecting unit 11 selects the battery board from which the characteristic is obtained among the battery boards 3-1 to 3-30. The distribution rate determining unit 12 determines the distribution rate for each of the battery boards 3-1 to 3-30. The SOC data obtaining unit 13 obtains data on the SOC of each battery boards 3-1 to 3-30 at an arbitrary time point, and data on the temperature at this time point, and stores those pieces of data. The arithmetic determining unit 14 calculates and determines whether or not the SOC and the chargeable and dischargeable maximum power are within respective predetermined ranges. The execution determining unit 15 determines whether or not to execute a test charging and discharging based on the above determination.

(Process Procedure by Battery Controller 1)

Figure 4:
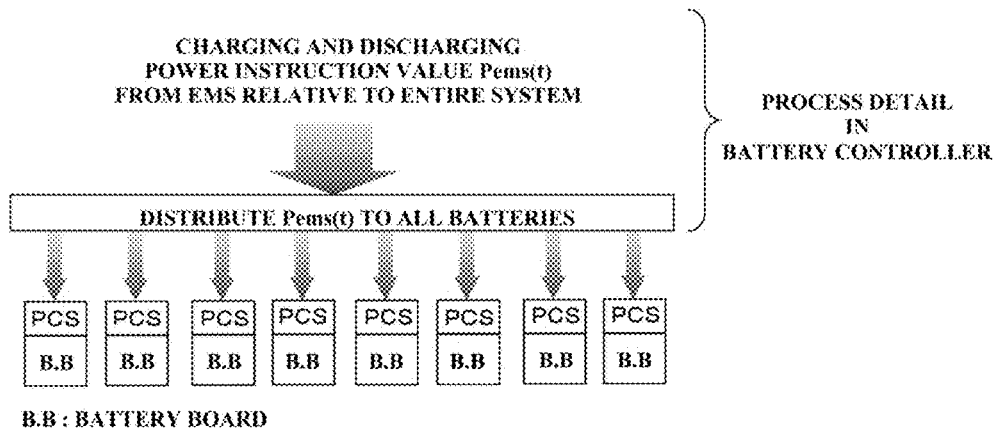
FIG. 4 is an explanatory diagram for power distribution to each battery when the battery controller is in a normal operation.

First, the process details by the battery controller 1 in a normal operation in which no characteristic parameter is obtained will be explained with reference to FIG. 4.

The distribution rate determining unit 12 (see FIG. 3) of the battery controller 1 receives, from the EMS 4, a charging and discharging power instruction value Pems (t) for the entire system at each process cycle (e.g., one second), and determines the distribution rate to each battery board (each battery group) for this charging and discharging power instruction value Pems(t). The specific distribution method is not directly relating to the present disclosure, and thus the detailed explanation thereof will be omitted. However, in consideration of the SOC status, etc., of each battery board, a control is made so as to reduce the charging power for the battery that is in a substantially full charge state, and to reduce the discharging power for the battery that is in a substantially complete discharge state.

Figure 5:
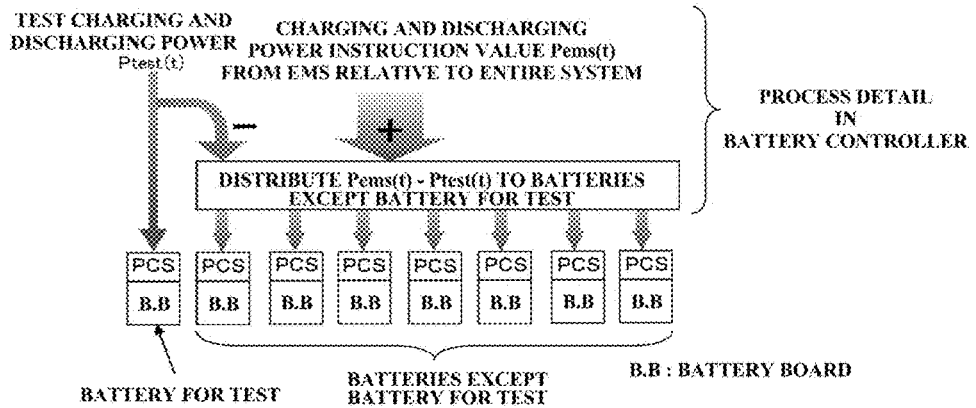
FIG. 5 is an explanatory diagram for power distribution to each battery when the battery controller is obtaining a characteristic parameters.

Next, the process details by the battery controller 1 when the characteristic parameter is obtained will be explained with reference to FIG. 5.

The selecting unit 11 (see FIG. 3) of the battery controller 1 selects one battery board from which the characteristic is obtained. When a characteristic obtaining process for the selected battery board starts, the distribution rate determining unit 12 gives, to the selected battery board for characteristic obtainment, a charging and discharging power instruction Ptest(t) in accordance with a test charging and discharging pattern.

Conversely, to all remaining battery boards except the battery board for characteristic obtainment, the distribution rate determining unit 12 distributes, in accordance with the following formula (1), a power value Prem(t) obtained by subtracting the above Ptest(t) from a total charging and discharging power value Pems(t) that is an instruction value from the EMS 4.

$$Prem(t)=Pems(t)-Ptest(t) \quad (1)$$

The determining method of the distribution rate to all remaining battery boards except the battery board for characteristic obtainment is basically the same as the distribution rate determining method in the normal operation except that the number of batteries for power distribution is decreased by one.

(Process Procedure to Determine Execution of Test Charging and Discharging)

In order to execute the obtaining process of the above characteristic parameters, it is important to determine, beforehand, whether or not the test charging and discharging is executable (in general, this takes several hours at maximum) based on the SOC of each battery board and the charging and discharging instruction value pattern of the EMS 4. When, for example, the instruction value from the EMS 4 is continuously zero, and when the SOCs of the remaining battery boards are all substantially full charge or complete discharge states while a charging is attempted to the battery for the test, it is difficult to execute the test charging and discharging so as to follow the instruction value from the EMS 4 (i.e., no charging and discharging is executed as a whole electricity storage system 10). Hence, a specific process procedure to check whether or not the test charging and discharging is executable will be explained below in accordance with conditions of applications.

Example conditions of applications are (1) when the EMS instruction value during a time period for execution of the test charging and discharging has been settled beforehand, and (2) when the EMS instruction value during that time period is uncertain beforehand like a case in which the EMS instruction value changes in accordance with a relationship between the energy demand and the energy supply in the power system. In both conditions, it is assumed that the test charging and discharging pattern for the battery for the test is predefined.

(1) When Charging and Discharging Schedule in Application During Test Charging and Discharging Execution Time Period in Immediate Future has been Settled Based on the charging and discharging power instruction value from the EMS 4 within this time period and the test charging and discharging power value, the SOC of the battery board except the battery for the test, and the maximum charging and discharging power value within this time period are obtained by calculation. Based on the calculation result, whether or not the following two conditions are satisfied is checked by calculation.

(i) The SOC is within an available SOC range (e.g., 0-100%) throughout this time period; and (ii) The maximum chargeable and dischargeable power is within the available charging and discharging power value range throughout this time period.

When both conditions are satisfied, the determination is made that the test charging and discharging is executable, and when either condition is not satisfied, the determination is made that the test charging and discharging is not executable.

(2) When Charging and Discharging Schedule in Application During Test Charging and Discharging Execution Time Period in Immediate Future is Uncertain In this case, it is difficult to precisely determine whether or not the test charging and discharging is executable beforehand. Hence, the test charging and discharging is executed when the charging and discharging available power is relatively large, and when it becomes difficult to comply with the instruction value from the EMS 4 during the execution due to the test charging and discharging, the test charging and discharging is terminated. When the following (iii) and (iv) conditions are satisfied, it is decided that the test charging and discharging is executable.

(iii) The present SOC of the battery board except the battery for the test is within a predetermined range (e.g., 40-60%); and (iv) The present maximum charging and discharging available power of the battery board except the battery for the test is within a predetermined range (e.g., equal to or greater than 1 MW (both charging and discharging)).

Figure 6:
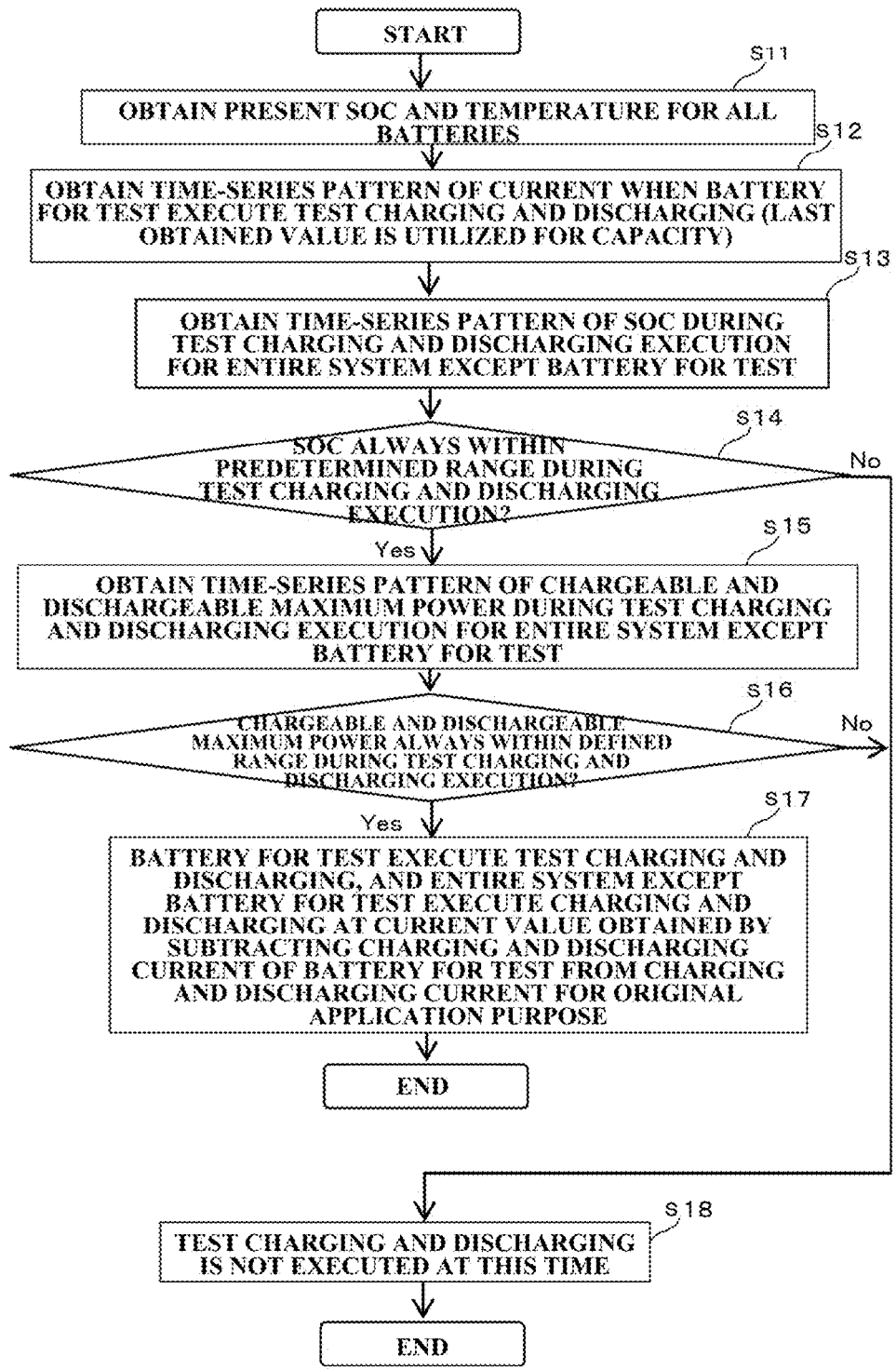
FIG. 6 is a flowchart illustrating a process procedure of a method of estimating characteristic parameters when a charging and discharging schedule has been settled.

FIG. 6 is a flowchart illustrating a process procedure of the method of estimating the characteristic parameters when the charging and discharging schedule has been settled beforehand.

In this process procedure, first, the SOC data obtaining unit 13 of the battery controller 1 obtains (step S11) the present SOC and temperature for all batteries.

Next, the arithmetic determining unit 14 obtains (step S12) a time-series pattern of the current when the battery for the test performs test charging and discharging. In this case, as for the capacity, the value obtained last time is utilized.

In addition, the arithmetic determining unit 14 obtains (step S13) a time-series pattern of the SOC during the test charging and discharging execution time period for the entire system except the battery for the test.

Next, the arithmetic determining unit 14 determines (step S14) whether or not the SOC is always within the predetermined range during the test charging and discharging time period, and obtains (step S15) a time-series pattern of the chargeable and dischargeable maximum power during the test charging and discharging time period for the entire system except the battery for the test when the SOC is within the predetermined range (step S14: YES).

In addition, the arithmetic determining unit 14 determines (step S16) whether or not the chargeable and dischargeable maximum power is always within the predetermined range during the test charging and discharging execution time period. When the chargeable and dischargeable maximum power is within the predetermined range (step S16: YES), the execution determining unit 15 determines to execute the test charging and discharging on the battery for the test.

The distribution rate determining unit 12 gives the test charging and discharging instruction to the battery for the test, and for the entire system except the battery for the test, the power is distributed (step S17) at a current value obtained by subtracting the charging and discharging current for the battery subjected to the test from the charging and discharging current for the original application purpose.

Conversely, when the SOC is not within the predetermined range (step S14: NO), or when the chargeable and dischargeable maximum power is not within the predetermined range (step S16: NO), the test charging and discharging is not executed (step S18) at this time.

Figure 7:
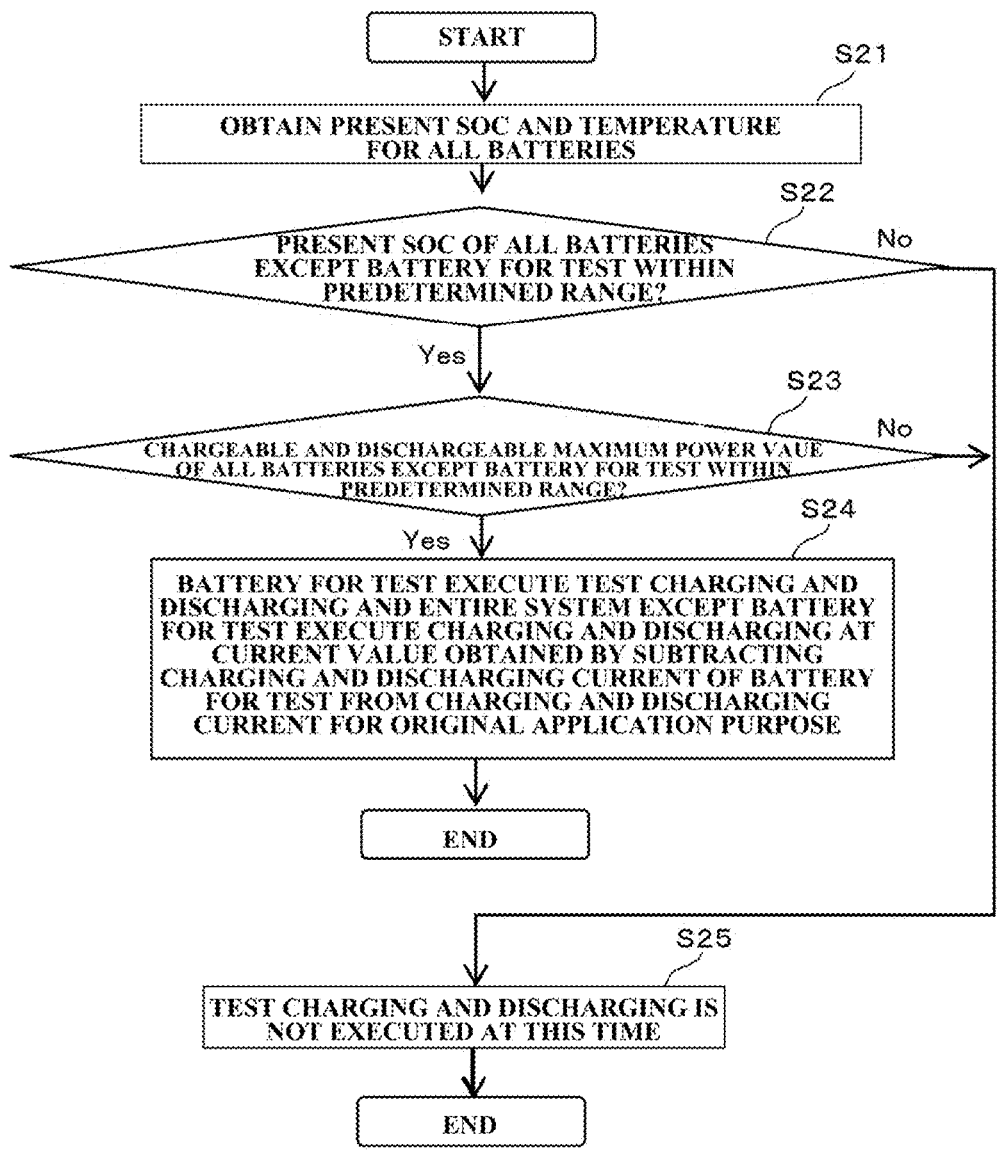
FIG. 7 is a flowchart illustrating a process procedure of the method of estimating the characteristic parameters when the charging and discharging schedule is uncertain.

FIG. 7 is a flowchart illustrating a process procedure of the method of estimating the characteristic parameters when the charging and discharging schedule is uncertain.

In this process procedure, first, the SOC data obtaining unit 13 of the battery controller 1 obtains (step S21) the present SOC and temperature for all batteries.

Next, the arithmetic determining unit 14 determines (step S22) whether or not the present SOCs of all batteries except the battery for the test are within the predetermined range, and determines (step S23) whether or not the chargeable and dischargeable maximum power of all batteries except the battery for the test are within the predetermined range when the present SOCs are within the predetermined range (step S22: YES). When the chargeable and dischargeable maximum power is within the predetermined range (step S23: YES), the execution determining unit 15 determines to execute the test charging and discharging on the battery for the test.

The distribution rate determining unit 12 gives the test charging and discharging power instruction to the battery for the test, and for the entire system except the battery for the test, the power is distributed (step S24) at a current value obtained by subtracting the charging and discharging current of the battery for the test from the charging and discharging current for the original application purpose. When it becomes difficult to comply with the instruction value from the EMS 4 during the execution due to the test charging and discharging, the test charging and discharging is terminated.

Conversely, when the SOC is not within the predetermined range (step S22: NO), or when the chargeable and dischargeable maximum power is not within the predetermined range (step S23: NO), the test charging and discharging is not executed (step S25) at this time.

(Effects)

(1) According to this embodiment, since the electricity storage system 10 needs no suspension, in comparison with a case in which the entire system is suspended and a test charging and discharging is executed to obtain the characteristic, the operation availability of the system for the original purpose is improved.

(2) Unlike this embodiment, when a part of the system is suspended and a test charging and discharging is executed to obtain the characteristic, all batteries except the battery for the test need to comply with the EMS instruction value Pems(t), and thus a disturbance (i.e., error relative to EMS instruction value) by the charging and discharging power for the characteristic obtainment is caused for the power system. In contrast, according to this embodiment, since the power value Prem(t) obtained by subtracting Ptest (t) from all charging and discharging power Pems (t) is distributed to all batteries except the battery for the test, a disturbance (error) as explained above is not caused. That is, in comparison with a case unlike this embodiment, the system is operable so as to follow the charging and discharging power instruction from the EMS 4 properly.

(3) When the characteristic value is estimated in an operated status without the system not being suspended, as explained in the field of background art, there is an inevitable technical problem that the estimation depends on the charging and discharging condition in the operated status. Conversely, according to this embodiment, in comparison with a case in which the characteristic value is estimated in the operated status without the system being not suspended, a highly precise characteristic is obtainable.

First Example

Figure 8:
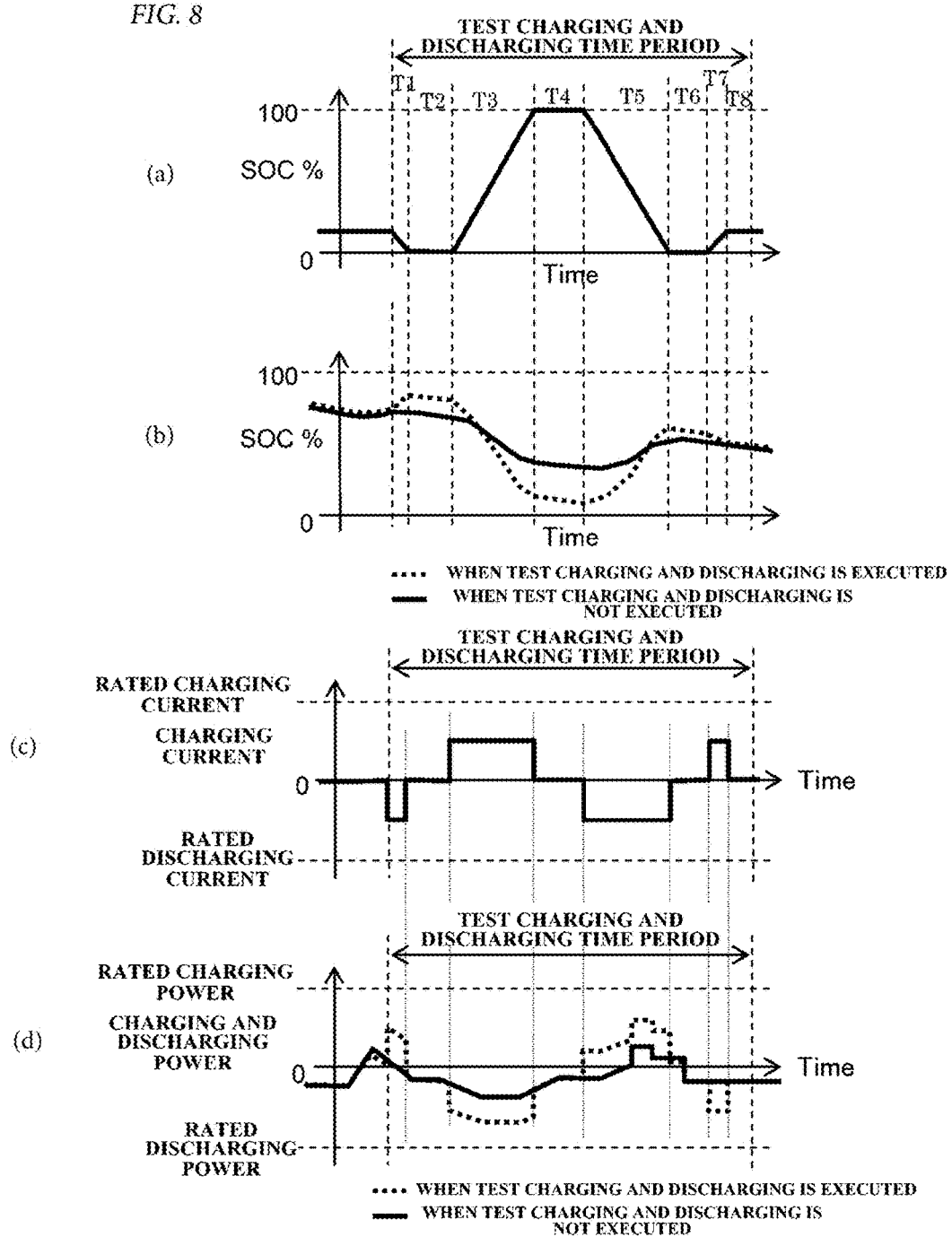
FIGS. 8(a)-8(d) are each a graph indicating a change over time in SOC, charging current, and charging and discharging power in a first example (where characteristic parameter is capacity), and FIG. 8(a) indicates the SOC of a battery for the test, FIG. 8(b) indicates the SOC of an entire system except the battery for the test, FIG. 8(c) indicates a charging current of the battery for the test, and FIG. 8(d) indicates the charging and discharging power of the entire system except the battery for the test.

FIGS. 8(*a*)-8(*d*) illustrates an example measurement how the SOC and the charging and discharging power change over time in accordance with the presence or absence of the test charging and discharging execution.

In FIGS. 8(*a*)-8(*d*), the characteristic parameter to be obtained is a discharging capacity. FIG. 8(*a*) illustrates a change over time in SOC of the battery for the test. As illustrated in FIG. 8(*a*), when the test charging and discharging time period started, first, the battery for the test discharged (T1) at a rated current value (e.g., equivalent to 1C), and come to a standstill (T2) when reaching the complete discharge status (SOC=0%). Charging was performed (T3) at the rated current value after the standstill time in the complete discharge status had elapsed, and the battery come to a standstill (T4) when reaching the full charge status (SOC=100%). Discharging was performed (T5) at the rated current value after the standstill time in the full charge status had elapsed, and the battery come to standstill (T6) when reaching the complete discharge status again. Charging was performed again (T7) at the rated current value after the standstill time in the complete discharge status had elapsed, the battery come to standstill (T8) when returning to the last (right before the test charging and discharging time period) SOC, and the test charging and discharging time period ended. In such a process, by integrating the current flowing through the battery for the test during the discharge time period (T5) from the full charge status to the complete discharge status, the characteristic parameter that is the value of the discharge capacity is obtainable.

FIG. 8(*b*) illustrates a change over time in SOC of the entire system except the battery for the test. In this case, a dotted line indicates a result when the test charging and discharging was executed, and a continuous line indicates a result when no test charging and discharging was executed. As is clear from those results, regarding the SOC, the SOC of the entire system except the battery for the test changes in accordance with the execution of the test charging and discharging so as to cancel a change in SOC of the battery for the test.

Next, FIG. 8(*c*) illustrates a change over time in charging current of the battery for the test, and FIG. 8(*d*) illustrates a change over time in charging and discharging power of the entire system except the battery for the test. In FIG. 8(*d*), a dotted line indicates a result when the test charging and discharging was executed, and a continuous line indicates a result when no test charging and discharging was executed. As is clear from the results in FIG. 8(*d*), the charging and discharging power waveform of the entire system except the battery for the test changes in accordance with the execution of the test charging and discharging so as to cancel the charging and discharging power of the battery for the test.

Second Example

In the first example, the characteristic parameter to be obtained was a discharge capacity, but when a sinusoidal waveform at a constant current is utilized as a test charging and discharging pattern, the internal resistance relative to the frequency of that waveform is obtainable. In addition, by changing the frequency in this case, the internal resistance is obtainable relative to each frequency from the low frequency to the high frequency. Still further, when an appropriate rectangular waveform is applied, a DC resistance is also obtainable.

Figure 9:
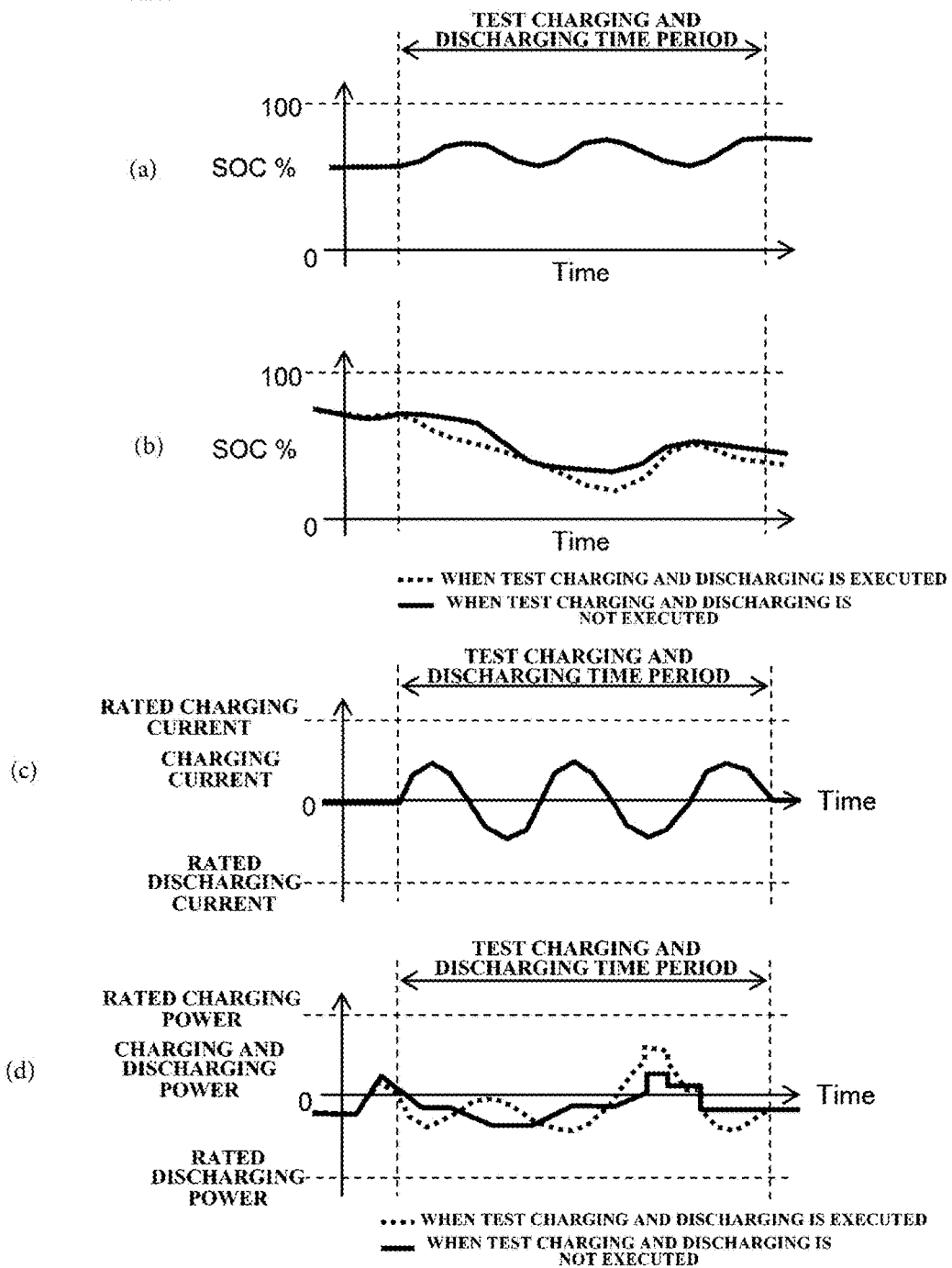
FIGS. 9(a)-9(d) are each a graph indicating a change over time in SOC, charging current, and charging and discharging power in a second example (where characteristic parameter is internal resistance), and FIG. 9(a) indicates the SOC of the battery for the test, FIG. 9(b) indicates the SOC of the entire system except the battery for the test, FIG. 9(c) indicates the charging current of the battery for the test, and FIG. 9(d) indicates the charging and discharging power of the entire system except the battery for the test.

FIGS. 9(*a*)-9(*d*) illustrate a result of a change over time in SOC and charging and discharging power when the characteristic parameter is an internal resistance.

FIG. 9(a) illustrates a change over time in SOC of the battery for the test, and a test charging and discharging pattern that is a sinusoidal waveform at a constant current is utilized.

FIG. 9(b) illustrates a change over time in SOC of the entire system except the battery for the test. In this case, a dotted line indicates a result when the test charging and discharging was executed, and a continuous line indicates a result when no test charging and discharging was executed.

As is clear from the results in FIG. 9(b), regarding the SOC, the SOC of the entire system except the battery for the test changes in accordance with the execution of the test charging and discharging so as to cancel a change in SOC of the battery for the test.

Next, FIG. 9(c) illustrates a change over time in charging current of the battery subjected to the test, and FIG. 9(d) illustrates a change over time in charging and discharging power of the entire system except the battery subjected to the test. In FIG. 9(d), a dotted line indicates a result when the test charging and discharging was executed, and a continuous line indicates a result when no test charging and discharging was executed.

As is clear from the results of FIG. 9(d), the charging and discharging power waveform of the entire system except the battery subjected to the test changes in accordance with the execution of the test charging and discharging so as to cancel the charging and discharging power of the battery subjected to the test.

Other Embodiments

In the above embodiment, since the battery board subjected to the characteristic obtainment is one, the similar procedures need to be repeated multiple times to obtain the characteristics of all battery boards in the electricity storage system 10. Conversely, execution of the test charging and discharging on equal to or greater than two battery boards simultaneously to obtain the characteristics of equal to or greater than the two battery boards is also possible by the similar method. This method is effective for a large-scale electricity storage system that has a relatively large system availability relative to the EMS instruction value.

Several embodiments of the present disclosure have been explained, but those embodiments are merely presented as examples, and are not intended to limit the scope of the present disclosure. Those embodiments can be carried out in other various forms, and various omissions, replacements, and modifications can be made thereto without departing from the scope of the present disclosure. Those embodiments and the modified forms thereof are within the scope of the present disclosure, and are also within the scope of the invention as recited in the appended claims and the equivalent range thereto.

REFERENCE SIGNS LIST

1 Battery controller
2-1 to 2-30 PCS (charging and discharging device)
3-1 to 3-30 Battery board (Battery)
4 EMS
5 Power system
10 Electricity storage system
11 Selecting unit
12 Distribution rate determining unit
13 SOC data obtaining unit
14 Arithmetic determining unit
15 Execution determining unit

The invention claimed is:

1. An electricity storage system comprising:
a plurality of chargeable and dischargeable batteries;
a plurality of charging and discharging devices connected to the respective batteries, and charging and discharging the connected batteries; and
a battery controller distributing a first charging and discharging power value to each of the charging and discharging devices at a constant cycle or at an arbitrary timing, the first charging and discharging power value being instructed for the entire system from an energy management system (EMS),
wherein the battery controller comprises:
a selecting unit selecting a battery from the batteries on which a predefined test charging and discharging is to be performed; and
a distribution rate determining unit giving, to the charging and discharging device, a charging and discharging instruction to perform the predefined test charging and discharging in accordance with a second charging and discharging power value to the selected battery, and distributing a third charging and discharging power value obtained by subtracting the second charging and discharging power value from the first charging and discharging power value to a remaining battery except for the selected battery; and
the battery controller obtains a characteristic parameter of the selected battery based on the predefined test charging and discharging.

2. The electricity storage system according to claim 1, wherein a pattern to measure a discharging capacity from a full charge status to a complete discharge status or a charging capacity from the complete discharge status to the full charge status is applied for the test charging and discharging.

3. The electricity storage system according to claim 1, wherein a repeated charging and discharging pattern with a constant amplitude and a constant frequency is applied for the test charging and discharging to obtain an internal resistance.

4. The electricity storage system according to claim 3, wherein a sinusoidal current waveform is applied as the charging and discharging pattern.

5. The electricity storage system according to claim 4, wherein the frequency of the sinusoidal waveform is changed over time.

6. The electricity storage system according to claim 1, wherein the number of batteries for the test is equal to or greater than two.

7. A method of obtaining characteristic parameters of each battery in an electricity storage system that is a combination of a plurality of the chargeable and dischargeable batteries, the method comprising:
distributing a first charging and discharging power value to each of a charging and discharging devices at a constant cycle or at an arbitrary timing, the first charging and discharging power value being instructed for the entire system from an energy management system (EMS),
selecting a battery from the batteries on which a predefined test charging and discharging is to be performed; and
giving, to the charging and discharging devices, a charging and discharging instruction to perform the predefined test charging and discharging in accordance with a second charging and discharging power value to the selected battery, and distributing a third charging and discharging power value obtained by subtracting the second charging and discharging power value from the first charging and discharging power value to a remaining battery except for the selected battery; and obtaining the characteristic parameter of the selected battery based on the predefined test charging and discharging.

8. The characteristic parameter obtaining method according to claim 7, wherein when a schedule for an execution time period of the test charging and discharging has been settled, and when an SOC and a maximum chargeable and dischargeable power of the batteries except the battery for the test are within respective available ranges throughout the execution time period, the test charging and discharging is executed.

9. The characteristic parameter obtaining method according to claim 7, wherein when a schedule for an execution time period of the test charging and discharging is uncertain, and when an SOC and a maximum chargeable and dischargeable power of the batteries except the battery for the test are within respective available ranges at a time point at which the schedule is uncertain, the test charging and discharging is executed.

\* \* \* \* \*